(12) United States Patent
Grote

(10) Patent No.: US 8,093,802 B1
(45) Date of Patent: Jan. 10, 2012

(54) LIGHT EMITTING DIODE WITH A DEOXYRIBONUCLEIC ACID (DNA) BIOPOLYMER

(75) Inventor: James G. Grote, Yellow Springs, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 302 days.

(21) Appl. No.: 12/578,609

(22) Filed: Oct. 14, 2009

(51) Int. Cl.
*H01L 27/15* (2006.01)
(52) U.S. Cl. .................................................. 313/504
(58) Field of Classification Search ........... 313/498–512
See application file for complete search history.

(56) References Cited

U.S. PATENT DOCUMENTS

| 6,652,808 B1 * | 11/2003 | Heller et al. | ................. 422/68.1 |
| 7,208,122 B2 * | 4/2007 | Swager et al. | ............. 422/82.05 |

* cited by examiner

*Primary Examiner* — Nimeshkumar Patel
*Assistant Examiner* — Christopher Raabe
(74) *Attorney, Agent, or Firm* — AFMCLO/JAZ; Bart Hersko

(57) ABSTRACT

The present invention uses a DNA-based biopolymer material as a host for phosphor guest materials that are used for solid state lighting. The DNA-biopolymer replaces the epoxies, which are typically used as the hosts for these phosphors. The resulting DNA-biopolymer phosphor can either be deposited directly on the light emitting diode die by casting or onto the inside of the lens or dome placed on top of the LED by casting, spin depositing, electro-spinning or vapor deposition. The purpose of the invention is to enhance the light output and efficiency of solid state lighting and to red shift the light emission or shift the emission to longer wavelength. This would render brighter solid state lighting that operates at lower input power, generate less heat and have longer lifetimes. It would also reduce or eliminate the cold or blue tinted color of solid state lighting by warming or red shifting the emission of these devices.

15 Claims, 3 Drawing Sheets

LIGHT EMITTING DIODE WITH A DEOXYRIBONUCLEIC ACID (DNA) BIOPOLYMER

RIGHTS OF THE GOVERNMENT

The invention described herein may be manufactured and used by or for the Government of the United States for all governmental purposes without the payment of any royalty.

BACKGROUND OF THE INVENTION

The present invention relates to solid state lighting. Similar to fluorescent lighting, solid state lighting uses phosphors to realize the desired color output.

Commercial solid state lighting typically uses gallium nitride (GaN) semiconductor based blue light emitting diodes (LEDs), operating at a wavelength of 450-500 nanometers (nm), that excites a yellow-emitting phosphor, which is embedded in the epoxy dome, converting some of the blue LED light to a wavelength of about 560 nm. The combination of blue and yellow renders a white emitting LED.

The yellow emitting phosphor used in commercial solid state lighting is cerium doped yttrium aluminum garnet (YAG:Ce) crystals that have been ground up into a powder and bound in an epoxy host. The resulting YAG:Ce doped epoxy is then cast onto the GaN LED die. The yellow light stimulates the red and green receptors of the eyes and the resulting mix of blue and yellow gives the appearance of white light. This white light, however, has a blue color tint to it. This is referred to as cold light. Increasing the wavelength of the light emitted by the phosphor, so it emits red, can reduce or eliminates the blue tint. This produces what is referred to as warm light.

YAG:Ce is also very efficient in blue to yellow light conversion. Newer phosphor blends have been produced that add more energy in the red region of the spectrum to produce this warmer light; however, they reduce the efficiency of the light output. This can also increase the heat produced by the device.

Also, the heat produced by the GaN LED die itself degrades the epoxy/phosphor material, thus reduces the lifetime of the device.

The present invention uses a DNA-based biopolymer material as a host for phosphor guest materials that are used for solid state lighting, such as the yellow emitting phosphor used in commercial solid state lighting, cerium doped yttrium aluminum garnet (YAG:Ce) crystals that have been ground up into a powder.

The DNA-based biopolymer material of the present invention acts to enhance the light output and efficiency of solid state lighting and to red shift the light emission or shift the emission to longer wavelength. This renders brighter solid state lighting that operates at lower input power, with less heat generated and has longer lifetimes. It also reduces or eliminates the cold or blue tinted color of solid state lighting by warming or red shifting the emission in these devices.

SUMMARY OF THE INVENTION

The present invention uses a DNA-based biopolymer material as a host for phosphor guest materials that are used for solid state lighting. Commercial solid state lighting typically uses gallium nitride (GaN) semiconductor based blue light emitting diodes (LEDs) that excites a yellow-emitting phosphor. The DNA-biopolymer replaces the epoxies, which are typically used as the hosts for these phosphors. The resulting DNA-biopolymer phosphor can either be deposited directly on the gallium nitride semiconductor-based light emitting diode die by casting or onto the inside of the lens or dome cap placed on top of the LED by casting, spin depositing, electro-spinning or vapor deposition.

A white light source according to the present invention comprises: a light emitting component which emits light at a first wavelength; and a deoxyribonucleic acid (DNA)-biopolymer-phosphor material positioned to receive the light emitted by the light emitting component and emit light, or fluoresce, at a second wavelength, where the human eye then integrates the two wavelengths to see white light. The DNA-biopolymer-phosphor material comprises a DNA-based biopolymer material and a phosphor material, wherein the DNA-based biopolymer material is a host for the phosphor material. The DNA-based biopolymer-phosphor material acts to emit light, or fluoresce, at a second wavelength, that is longer than epoxy-based-phosphor materials. The DNA-based biopolymer-phosphor material enhances the light output and efficiency of the light output.

All percentages and ratios, used herein, are "by weight" unless otherwise specified. All molecular weights, used herein, are weight average molecular weights unless otherwise specified. Further details and advantages of the present invention are set forth below in the following more detailed description.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein.

DETAILED DESCRIPTION

Figure 1:
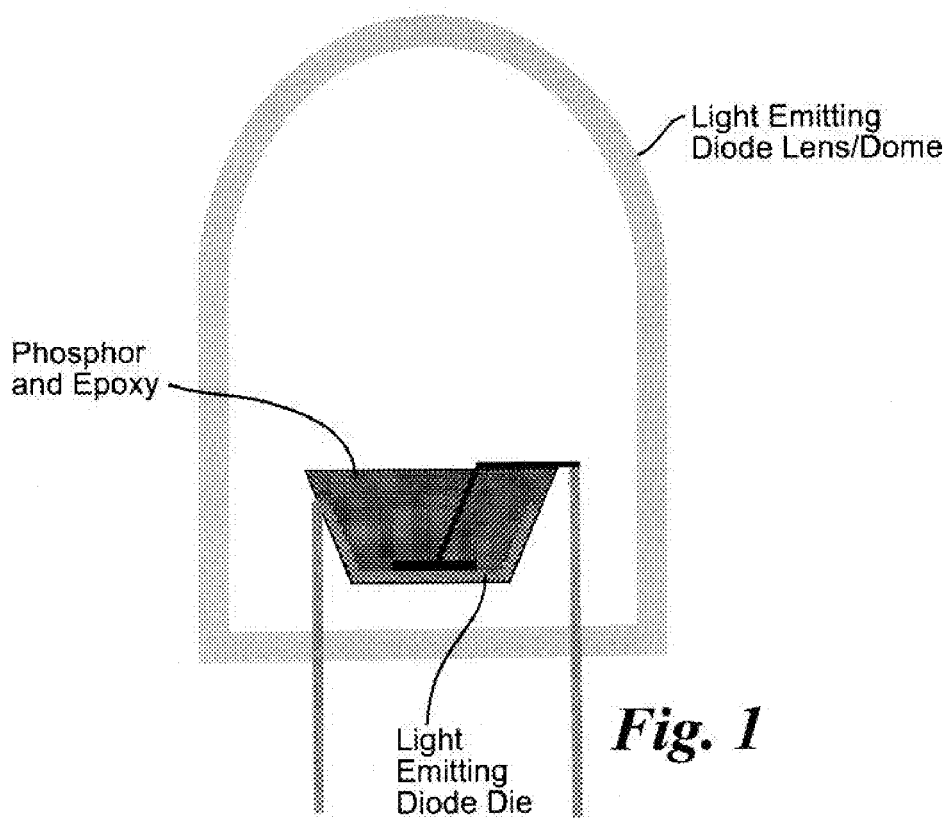
FIG. 1 is a schematic of commercial white light emitting diode solid state light.

Similar to fluorescent lighting, solid state lighting uses phosphors to realize the desired color output. Commercial solid state lighting typically uses gallium nitride (GaN) semiconductor based blue light emitting diodes (LEDs), operating at a wavelength of 500-700, preferably about 560 nanometers (nm), that excites a yellow-emitting phosphor, which is embedded in the epoxy dome, converting some of the blue LED light to a wavelength of about 540 to about 740, preferably about 600 nm. The combination of blue and yellow renders a white emitting LED. See FIG. 1 which shows a schematic of commercial white light emitting diode solid light.

The yellow emitting phosphor used in commercial solid state lighting is cerium doped yttrium aluminum garnet (YAG:Ce) crystals that have been ground up into a powder and bound in an epoxy host. The resulting YAG:Ce doped epoxy is then cast onto the GaN LED die. The yellow light stimulates the red and green receptors of the eyes and the resulting mix of blue and yellow gives the appearance of white light. This white light, however, has a blue color tint to it. This is referred to as cold light. Increasing the wavelength of the light emitted by the phosphor, so it emits red, would reduce or eliminate the blue tint. This would produce what is referred to as warm light.

YAG:Ce is also a very efficient in blue to yellow light conversion. Newer phosphor blends have been produced that add more energy in the red region of the spectrum to produce this warmer light, however, they reduce the efficiency of the light output. This can also increase the heat produced by the device.

The heat produced by the GaN LED die degrades the epoxy/phosphor material, thus reduces the lifetime of the device.

The present invention uses a DNA-based biopolymer material as a host for phosphor guest materials that are used for solid state lighting, such as the yellow emitting phosphor used in commercial solid state lighting, cerium doped yttrium aluminum garnet (YAG:Ce) crystals that have been ground up into a powder.

The DNA-based biopolymer material of the present invention acts to enhance the light output and efficiency of solid state lighting and to red shift the light emission or shift the emission to longer wavelength. This renders brighter solid state lighting that operates at lower input power and have longer lifetimes. It also reduces or eliminates the cold or blue tinted color of solid state lighting by warming or red shifting the emission in these devices.

A promising new material, DNA-biopolymer, has been identified for optical, electro-optical, optical memory and optical amplifier applications. See e.g., E. M. Heckman, J. G. Grote, P. P. Yaney, and F. K. Hopkins, "DNA based nonlinear photonic materials," *SPIE Proceedings*, edited by A. T. Yates, 5516, pp. 47-53 (2004), incorporated herein by reference. For that work the DNA was processed from salmon roe and milt sacs, a waste product of the Japanese fishing industry, and is therefore abundant and inexpensive.

Other suitable sources for the DNA can include, but are not limited to, any biological or natural DNA, which is derived from fish, animals or plants; plasmid DNA, which is derived from bacteria used to produce such products as enzyme-based or protein-based products; and synthetic DNA.

The following is an example of a detailed description of methods of preparation and use of the DNA-based biopolymer materials that can be applied for the present invention. The detailed descriptions fall within the scope of, and serve to exemplify, the more general description set forth above. The examples are presented for illustrative purposes only, and are not intended as a restriction on the scope of the invention.

The DNA used in the present invention can be genomic type such as that extracted through an enzyme isolation process by the Chitose Institute for Science and Technology (CIST), or plasmid type or synthetic type. Although the DNA processing discussed below is based on the DNA received from CIST, it can apply to other types of DNA as well. The DNA from CIST requires much additional processing to make it compatible with photonics applications.

The molecular weight of the DNA provided by CIST is, on average, greater than 8,000,000 Daltons (Da). This high molecular weight DNA is difficult to process into an optical quality film due to its increased viscosity in solution. In addition, for some applications, it may be desirable to use a lower molecular weight DNA. To reduce the molecular weight, an ultrasonic processor is used. For example, the Sonics & Materials ultrasonic processor model VC-750 with a 19 millimeter (mm) diameter high-gain solid probe can process up to 500 milliliters (mL) of solution and can reduce the molecular weight of the CIST DNA to as low as 200,000 Da.

Figure 2:
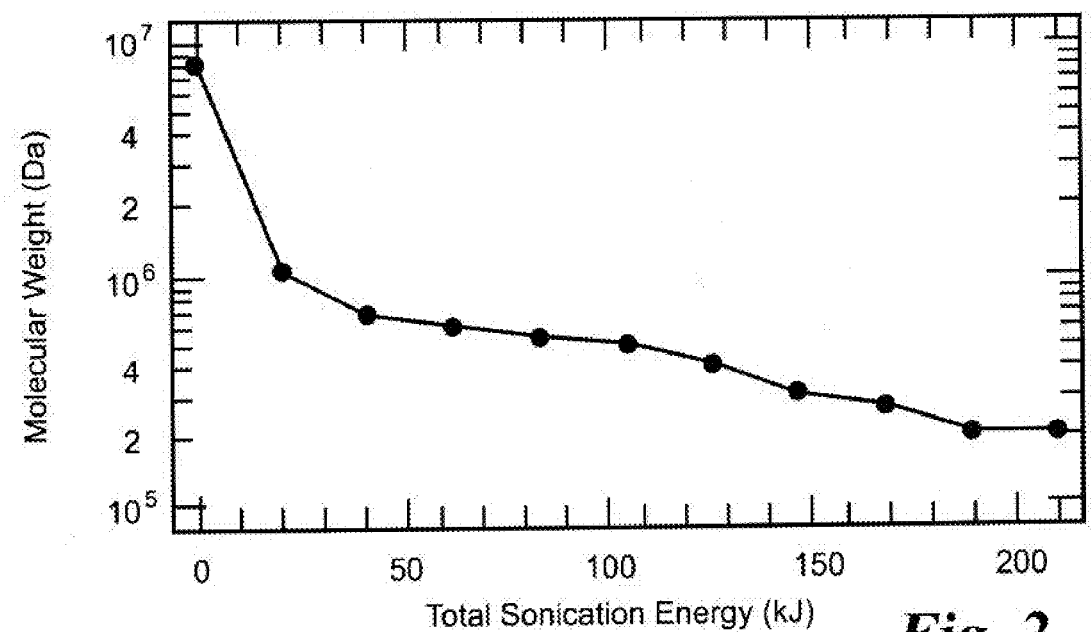
FIG. 2 is a plot of the molecular weight in Daltons of DNA as a function of total sonication energy in kilojoules.

First, 2 grams (g) of DNA are dissolved in 500 mL of 14 megaohm-centimeters (MΩ-cm) distilled/deionized water at room temperature. The DNA is then sonicated on ice in ten-second pulses with a twenty-second rest period between each pulse using the Sonics & Materials ultrasonic processor model VC-750 described above. FIG. 2 shows the molecular weight as a function of total sonication energy.

Sonication does not uniformly reduce the size of the DNA strands; rather it randomly breaks the DNA into a Gaussian-like distribution of molecular weights. The molecular weight reported is the mean of this distribution of molecular weights with a range of approximately ±50%. The molecular weight is measured using agarose gel electrophoresis with a 0.8% agarose gel. After sonication, the aqueous DNA solution is filtered through a nylon filter with a 0.45 micrometer (μm) pore size to remove any particles created during sonication.

The DNA is initially soluble only in aqueous solutions and does not dissolve in any organic solvent. Applicants precipitated it with the cationic surfactant complex hexadecyltrimethylammonium-chloride (CTMA) to make it water insoluble. The DNA is dissolved at room temperature in 14 MΩ-cm distilled/deionized water at a ratio of 4 grams per liter (g/L) using a magnetic stirrer. If necessary, the molecular weight of the DNA is first reduced with the ultrasonic processor as previously described. An equal amount by weight of CTMA is likewise dissolved in 14 MΩ-cm distilled/deionized water, also at a concentration of 4 g/L. The DNA solution is added drop-wise to the CTMA solution with a burette. A white DNA-CTMA precipitate forms as the DNA is added to the CTMA. The solution is mixed for an additional four hours at room temperature. The precipitate is removed by filtering the solution under vacuum using a nylon filter with a pore size of 20 μm. During the filtering process, an additional 3 to 4 liters (L) of 14 MΩ-cm distilled/deionized water are poured through the filter to rinse the precipitate and to ensure that any CTMA that did not bind to the DNA is thoroughly rinsed away. The precipitate is then collected, placed in a Teflon beaker and dried in a vacuum oven overnight at 40 degrees centigrade (° C.). Although CTMA was used for the processing described above, other suitable surfactants are acceptable as well. The goal is to render DNA insoluble in aqueous solutions and increase the mechanical and thermal stability.

The resulting DNA-CTMA compound, or biopolymer, is soluble in many of the alcohols including butanol, methanol, ethanol, and isoproponal, as well as an alcohol-chloroform blend. To spin deposit a thin film for photonics applications, butanol is the solvent of choice because its slow evaporation due to a high boiling point (116-118° C.), which ensures a smooth, uniform film during the spin coating process. The amount of solvent used in dissolving the DNA-biopolymer is dependent on the molecular weight of the starting DNA. Higher molecular weight (>1,000,000 Da) DNA forms a more viscous solution than lower molecular weight (300,000 Da) DNA. A greater amount of solvent is, therefore, required for higher molecular weight DNA. For example, for DNA with a starting molecular weight of 8,000,000 Da, DNA-biopolymer is dissolved in butanol at a concentration ranging from 39.8 to 54.2 millimole per base pair (mM-bp$^{-1}$) (referenced to the molecular weight of the DNA-biopolymer base pair of 1299.5 grams per mole per base pair (g/mol/bp)). For a lower molecular weight of 200,000 Da, a concentration between 85.0 and 110.0 mM-bp$^{-1}$ is used.

To make a thin film, the DNA-biopolymer is dissolved in butanol at a concentration appropriate for its molecular weight. The solution is mixed in a sealed glass bottle, in a 60° C. oven, using an ATR Rotamix until fully dissolved. Once completely dissolved, the solution is filtered through a 0.2 μm pore size syringe filter. Because DNA-biopolymer solutions can become quite viscous at room temperature, the filtering takes place inside the 60° C. oven using a syringe pump. The solution is left to sit overnight in a tightly capped container in the 60° C. oven to allow any micro-bubbles induced by filtering to dissipate. It is then spin deposited on to a substrate at a speed of between 600 to 800 revolutions per minute (rpm) for 10 seconds. After spinning, the sample is placed in an oven and cured in an 80° C. oven for 1 hour in order to evaporate the solvent. This results in a solid film of DNA material on the surface of the substrate. Applicant has found that the film thickness is quite sensitive to the DNA-biopolymer concentration for a given molecular weight and, as might be expected, higher concentrations are possible with the lower molecular weights.

The resulting DNA-biopolymer films, while of high optical quality, are soft and scratch easily (a visible mark is left on the film when scratched by a fingernail). This makes them incompatible with more aggressive processing techniques, such as sawing, that are often required to fabricate a photonic device. One solution to this problem is to crosslink the DNA-biopolymer films. A crosslinker identified for this work was poly (phenyl isocyanate)-co-formaldehyde (PPIF). The resulting crosslinked DNA-biopolymer films were significantly harder (the films show no mark when scratched by a fingernail) than the non-crosslinked films and are also resistant to the solvents used to process the films.

To prepare a crosslinked DNA-biopolymer film, the DNA-biopolymer is dissolved in butanol at a concentration appropriate for its molecular weight. An amount of 81.2 mol % PPIF, with respect to DNA-biopolymer, is dissolved separately in butanol at a concentration of 0.51 M. Both the DNA-biopolymer-butanol and PPIF-butanol solutions are mixed in a 60° C. oven for 1 to 2 hours. Once fully dissolved, the DNA-biopolymer-butanol solution is added to the PPIF-butanol solution and the resulting solution is mixed for an additional two hours in the 60° C. oven. The DNA-biopolymer-PPIF solution is then filtered through a 0.2 μm pore size syringe filter and left to sit overnight in the 60° C. oven. It is spin deposited on to a substrate using the same spin parameters as the non-crosslinked DNA-biopolymer films. The substrates are baked in an 80° C. oven for five minutes and then cured in a vacuum oven at 160° C. for 1 to 2 hours. Other suitable types of crosslinkers are acceptable as well.

The above processing procedures produce consistently high quality optical DNA-biopolymer films. Both the crosslinked and non-crosslinked DNA-biopolymer films are suitable for a wide range of photonic applications. Applicant's measurements show that the non-crosslinked DNA-biopolymer films have low optical absorption loss (<1 decibels per centimeter (dB/cm)) at the communications wavelengths. The crosslinked films introduce slightly higher optical loss (~25%-40% increase) than the non-crosslinked films; however, the losses are still within acceptable limits for a photonics device. The crosslinked films have the additional advantage of being able to withstand more demanding fabrication procedures than non-crosslinked films due to their increased hardness. Crosslinked films are also resistant to a wider range of solvents, including butanol and other alcohols. This allows multi-layer DNA-biopolymer based structures to be fabricated.

Figure 3:
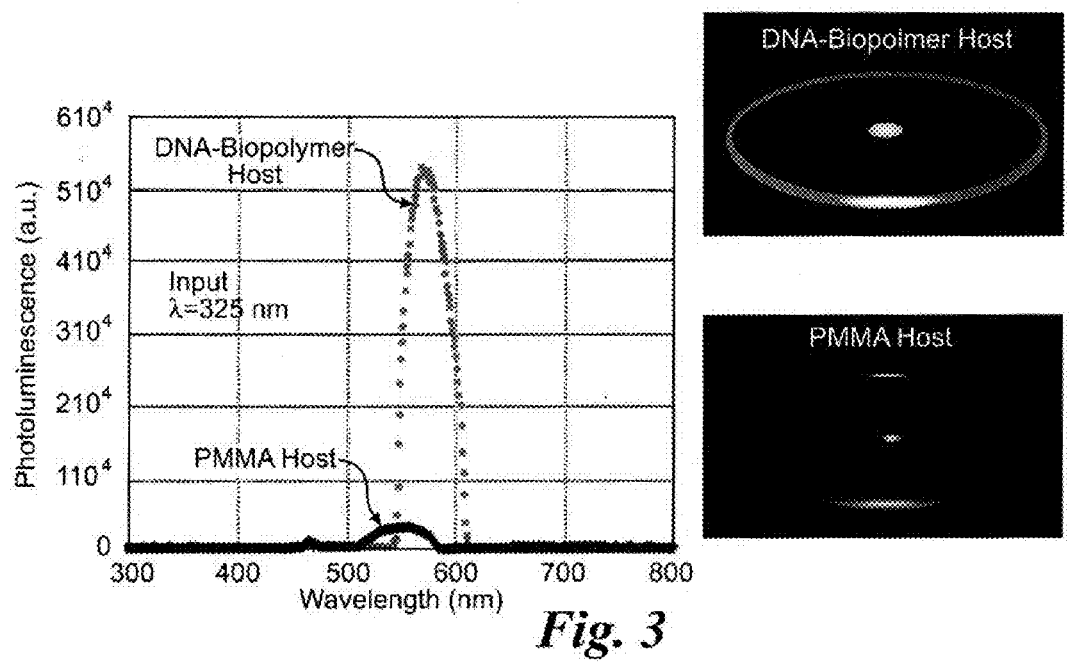
FIG. 3 is a plot and photo of the photoluminescence of 2% fluorescent dye, 4-[4-(dimethylamino)stylyl]-1-dococylpyridinium bromide (DMASDPB), blended in an un-crosslinked DNA-biopolymer host and a polymethylmethacrylate (PMMA) host optically pumped at 325 nm wavelength.

A fluorescent dye, 4-[4-(dimethylamino)styly1]-1-doco-cylpyridinium bromide (DMASDPB), was blended in an uncrosslinked DNA-biopolymer host, using butanol solvent, at a ratio of 2% DMASDPB to DNA-biopolymer and spin deposited on a glass slide. A second sample was prepared consisting of 2% DMASDPB in polymethylmethacrylate (PMMA), or plexiglass, for comparison. The resulting films were cured in an oven using the procedures described above. The materials were optically pumped at a wavelength of 325 nm. The fluorescence measured 100 times higher for DMAS-DPB in DNA-biopolymer host. See FIG. 3. The maximum fluorescence was at a wavelength of 580 nm using the DNA-biopolymer host and 540 nm using the PMMA host. This corresponds to a 40 nm red shift in the color of the output light.

Figure 4:
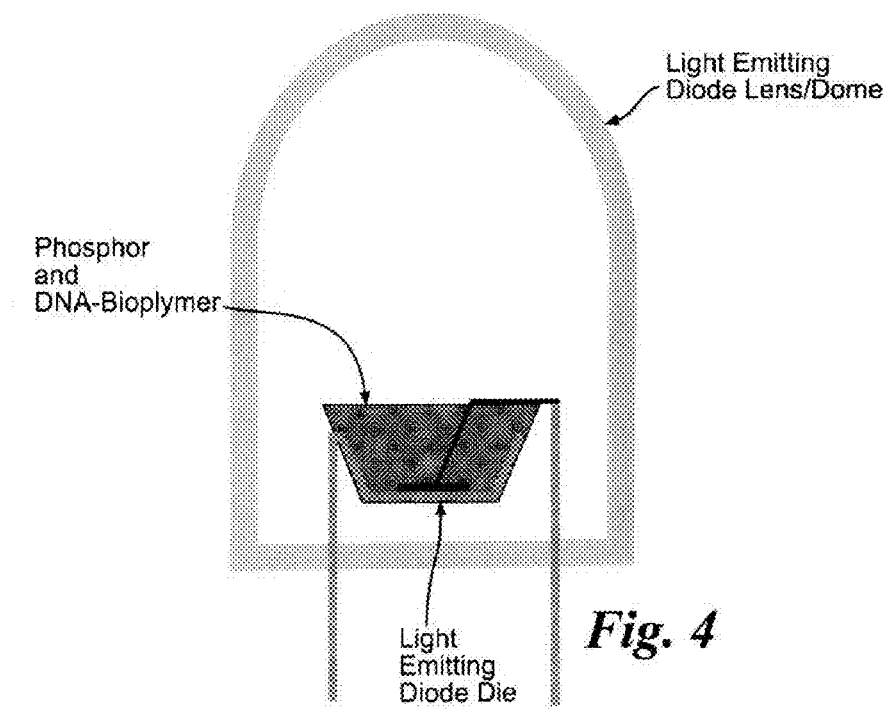
FIG. 4 is a schematic of the proposed light emitting diode-based solid state light using a DNA-biopolyer phosphor coating on light emitting diode die.

The resulting DNA-biopolymer phosphor material could realize the same 40 nm red shift. It could be deposited directly on the light emitting diode die by casting or spin coating (FIG. 4)

Figure 5:
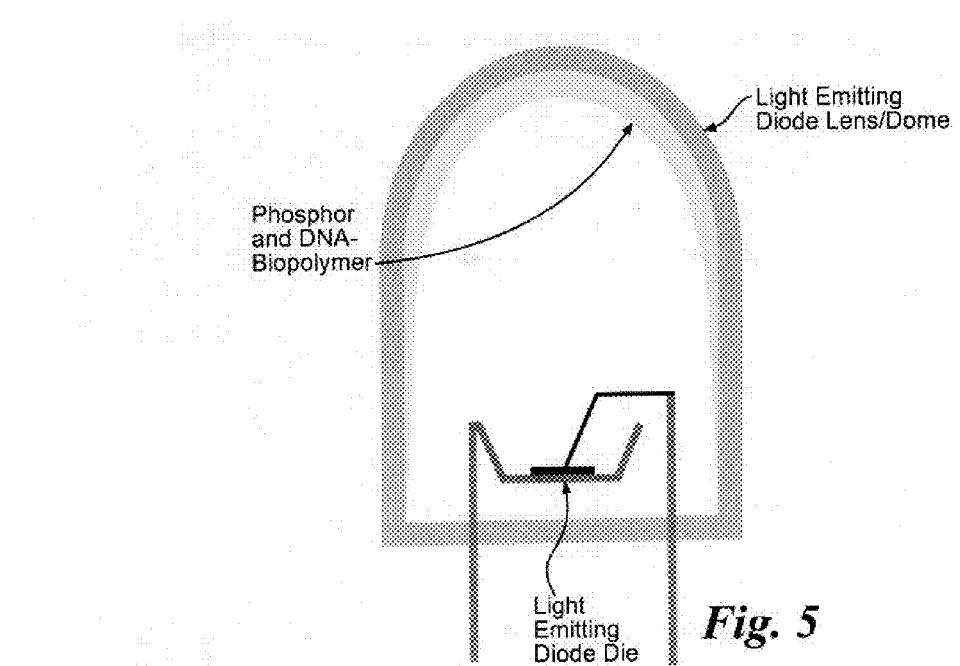
FIG. 5 is a schematic of the proposed light emitting diode-based solid state light using a DNA-biopolyer phosphor coating on light emitting diode lens/dome cap.

In an alternate embodiment, the resulting DNA-biopolymer phosphor material could be deposited onto the inside of the lens or dome cap placed on top of the light emitting diode by casting, spin coating, electro-spinning or vapor depositing (FIG. 5).

Figure 6A:
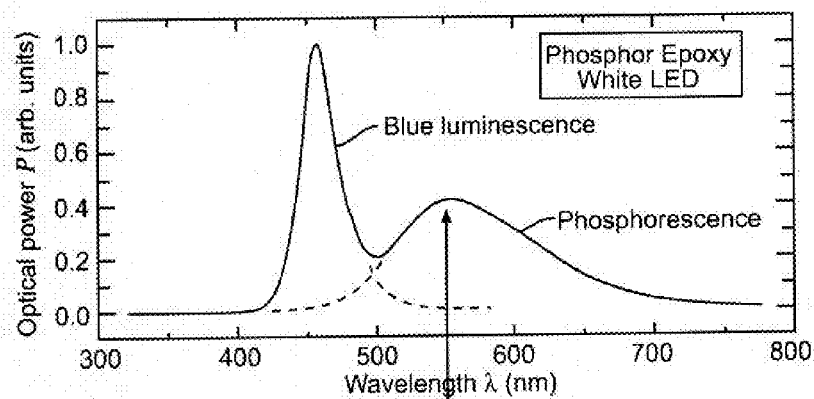
FIG. 6 is a) the emission spectrum of commercial phosphor-epoxy based white light emitting diode and b) the potential "red shifted" emission spectrum of a phosphor-DNA-biopolymer based light emitting diode.
Figure 6B:
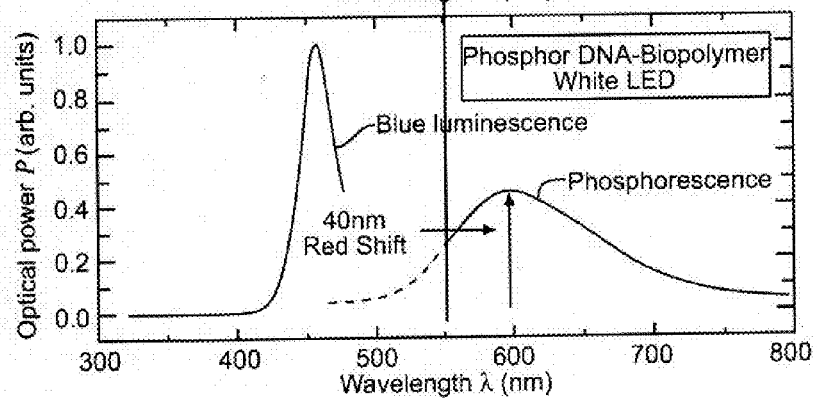

The DNA-based biopolymer material of the present invention acts to enhance the light output and efficiency of solid state lighting and to red shift the light emission or shift the emission to longer wavelength (FIG. 6).

While this invention has been described with respect to embodiments of the invention, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A white light source comprising: a light emitting component which emits light at a first wavelength; and a deoxyribonucleic acid (DNA)-biopolymer-phosphor material positioned to receive the light emitted by the light emitting component and emit light, or fluoresce, at a second wavelength, where the human eye then integrates the two wavelengths to see white light, the DNA-biopolymer-phosphor material comprising a DNA-based biopolymer material and a phosphor material, wherein the DNA-based biopolymer material is a host for the phosphor material, wherein the DNA-based biopolymer-phosphor material acts to emit light, or fluoresce, at a second wavelength, that is longer than epoxy-based-phosphor materials, wherein the DNA-based biopolymer-phosphor material will enhance the light output and efficiency of the light output.

2. The light source of claim 1 wherein the DNA-based biopolymer-phosphor acts to shift the emitted light, or the fluorescence, of the second wavelength to a longer wavelength.

3. The light source of claim 1 wherein the light emitting component comprises a light emitting diode (LED).

4. The light source of claim 3 wherein the LED includes a gallium arsenide (GaN)-based semiconductor material or organic-based material.

5. The light source of claim 3 wherein the LED emits blue light.

6. The light source of claim 5 wherein the DNA-based biopolymer-phosphor acts to shift the wavelength range of the fluorescent light emitted, after receiving the light emitted from the blue LED at a wavelength range of from about 500 to about 700 nanometers, to a wavelength range of from about 540 to about 740 nanometers, resulting in a red shift of about 40 nanometers.

7. The light source of claim 6 wherein the DNA-based biopolymer-phosphor acts to shift the peak wavelength of the fluorescent light emitted, after receiving the light emitted from the blue LED at a wavelength range of about 560 nanometers; to a peak wavelength of about 600 nanometers, resulting in a red shift of about 40 nanometers.

8. The light source of claim 5 wherein the DNA-based biopolymer-phosphor acts to increase the brightness of the fluorescent light emitted after receiving the light emitted from the blue LED.

9. The light source of claim 5 wherein the DNA-based biopolymer-phosphor acts to increase the efficiency of the fluorescent light emitted after receiving the light emitted from the blue LED.

10. The light source of claim 5 wherein the DNA-based biopolymer-phosphor material will reduce the amount of energy that is converted to heat, reducing the temperature produced by the light source.

11. The light source of claim 10 wherein the DNA-based biopolymer-phosphor increases the lifetime of the light source.

12. The light source of claim 5 wherein the phosphor material comprises a yellow-emitting phosphor.

13. The light source of claim 12 wherein the yellow-emitting phosphor comprises cerium doped yttrium aluminum garnet (YAG:Ce)-based or other rare earth-based crystals that have been ground up into a powder.

14. The light source of claim 1 wherein the DNA in the DNA-based biopolymer-material is either genomic, plasmid or synthetic-based.

15. The light source of claim 3 where the LED has a lens or dome cap and wherein the DNA-biopolymer-phosphor material is coated on the surface of the LED lens or dome cap, moving the DNA-biopolymer-phosphor material farther away from the LED and reducing the heat absorbed by the phosphorescent material and further increasing the lifetime of the light source.

* * * * *